United States Patent [19]

Drowley et al.

[11] Patent Number: 5,310,711
[45] Date of Patent: May 10, 1994

[54] METHOD OF FORMING DOPED SHALLOW ELECTRICAL JUNCTIONS

[75] Inventors: Clifford I. Drowley, Phoenix, Ariz.; John E. Turner, Woodside, Calif.

[73] Assignee: Hewlett-Packard Company, Palo Alto, Calif.

[21] Appl. No.: 101,145

[22] Filed: Aug. 2, 1993

Related U.S. Application Data

[62] Division of Ser. No. 694,309, May 1, 1991, Pat. No. 5,256,162.

[51] Int. Cl.⁵ .......................................... H01L 21/22
[52] U.S. Cl. .......................... 437/141; 437/165; 437/166; 437/233; 437/234; 437/937; 437/950; 148/DIG. 30; 148/DIG. 17; 148/DIG. 144
[58] Field of Search ............... 437/141, 165, 166, 233, 437/234, 937, 950; 148/DIG. 30, DIG. 17, DIG. 144

[56] References Cited

U.S. PATENT DOCUMENTS 5,124,272 6/1992 Saito et al. .................... 437/946
5,183,777 2/1993 Doki et al. .................... 437/950

OTHER PUBLICATIONS

Hsueh in "Phosphorus diffusion in silicon using Phosphene" J. Electro Chem. Soc. Solid state sci. vol. 117(6), Jun. 1970, pp. 807–811.

Garg et al. in "Use of POCl₃x for diffusion of phosphorus into silicon" Indian Journal of Technology vol. 8, May 1970, pp. 172–174.

*Primary Examiner*—R. Bruce Breneman
*Assistant Examiner*—Ramamohan Rao Paladugu

[57] ABSTRACT

Very shallow electrical junctions may be formed in an oxide free surface of a semiconductor by introducing an inert or reducing gas into a vacuum processing chamber, heating the semiconductor to between 750° C. and 1100° C., introducing a dilute solution of a dopant gas into the chamber, and exposing the semiconductor to the gases for about 0.5 to about 100 minutes, preferably between 10 and 30 minutes. A relatively wide range of surface dopant concentrations may be achieved thereby with dopant concentration controlled independent of junction depth. Non-oxide free semiconductor surfaces may be made oxide free by first heating the semiconductor surface in the presence of the reducing gas. This technique provides uniform surface dopant concentrations and is suitable for the formation of junctions in deep trenches and other features having high aspect ratios.

11 Claims, 2 Drawing Sheets

METHOD OF FORMING DOPED SHALLOW ELECTRICAL JUNCTIONS

CROSS REFERENCE TO RELATED APPLICATIONS

This is a divisional application Ser. No. 07/694,309 filed on May 1, 1991, now U.S. Pat. No. 5,256,162.

BACKGROUND OF THE INVENTION

1. Field of the Invention

This invention generally relates to the formation of electrical junctions in semi-conductors and more particularly to the formation of very shallow junctions with controlled dopant concentration and junction depth.

2. Description of the Prior Art

The formation of very shallow electrical junctions, e.g., less than about 0.2 $\mu$m deep, is currently a limiting factor in the development of advanced silicon integrated circuits. Such very shallow junctions can be formed when a p-type or n-type dopant is introduced into the surface of a semiconductor of the opposite conductivity type. Such p-n or n-p junctions may be used, for example, in the formation of the source and drain of insulated-gate field-effect transistors or in the formation of the base and emitter of bipolar junction transistors.

In certain bipolar junction transistor processes, a shallow, lightly doped junction is often used to form a link between an active intrinsic base region and the extrinsic base contact region. Shallow junctions may also be used to control the conductivity of sidewalls in trenches and other features formed in silicon.

Junctions in silicon surfaces have conventionally been formed by many techniques including ion implantation, doped glass and vapor diffusion. One of the limitations of ion implantation is the difficulty of achieving sufficiently precise depth control to reliably form very shallow junctions. The doped glass technique achieves the desired shallow junction depth but may not provide the needed range of dopant concentrations. Moreover, neither the ion implant nor the doped glass technique is normally considered suitable for creating shallow junctions on a semiconductor feature having a narrow opening, such as a deep trench.

Conventional vapor diffusion techniques have been considered for use in forming electrical junctions, including the two zone furnace process and the closed box process. Both of these techniques, which are discussed in more detail below, are typically limited to forming junctions with high dopant concentrations.

In the ion implantation method, dopant atoms of the appropriate type are ionized and accelerated toward a semiconductor surface, typically silicon. The ions penetrate the lattice of the silicon atoms to a degree determined by the ion energy, the ion mass, the orientation of the lattice relative to the ion beam, and the degree of crystallinity of the silicon. This technique offers good dopant control and good uniformity across the semiconductor surface, but it is often very difficult to control the depth of shallow junctions formed by this technique.

As stated above, one factor determining the depth of penetration of the dopant ions is the mass of the ions used. Ions having a higher mass, such as arsenic, are more controllable than ions having a lower mass, such as boron. Boron ions are preferred, but they experience less energy loss when passing through crystalline silicon and tend to channel into the spaces between adjacent atoms in the lattice. This results in the boron ions forming a deeper and poorly controlled junction.

Several approaches have been proposed to avoid the channeling effect of boron ions: misorienting the semiconductor surface relative to the ion beam; randomizing the ion beam by covering the surface with an amorphous film such as silicon dioxide; and randomizing the lattice by the implantation of a heavy ion such as germanium, tin or antimony, to create an amorphous layer of silicon on the surface of the semiconductor. With the last described approach, the amorphous layer may be recrystallized during a subsequent heat treatment to restore the lattice and activate the dopant.

Although these approaches have achieved some success in the formation of very shallow junctions using boron, these conventional approaches suffer from drawbacks. The first approach of misorienting the semiconductor surface relative to the ion beam is not completely effective. A small percentage of the boron atoms still tend to channel even at large angles. The second approach of covering the surface with an amorphous film suffers from a similar limitation, unless a comparatively thick film layer is used, in which case depth control is poor.

The third approach of implanting heavy ions requires an extra implantation step, using ions not conveniently available in production implanters. Further, the use of germanium or tin ions can result in defect structures which do not anneal out completely during the subsequent heat treatment. The use of antimony ions minimizes this problem, but antimony acts as an n-type dopant which adversely affects the resistivity control of the final doped region. Further, the presence of antimony requires higher concentrations of boron ions to achieve a given carrier concentration, limiting the use of antimony to relatively heavily doped junctions.

The second technique currently used for forming shallow junctions in silicon, drives in the dopant from a doped glass. A doped glass, as will be described below in greater detail, is formed on the surface of the silicon. The glass formation is followed by a heat treatment which drives the dopant out of the glass into the silicon. This technique allows comparatively good control of dopant dose and uniformity, at high dopant concentrations, and is usable in forming reasonably shallow junctions.

However, it is difficult to control the dopant concentration at lower concentration levels because the concentration changes greatly with only a slight change in the heat treatment temperature. A further drawback of this technique is that it requires extra processing steps.

During this technique, doped glass is typically formed on the silicon surface by introducing a dopant-containing gas into a high-temperature reaction furnace. The gas is reacted with oxygen either by itself to form an oxide of the dopant, for example $B_2O_3$, or with a silicon containing gas such as silane to form a doped silicate glass on the surface of the semiconductor. Subsequent heating of the coated semiconductor surface results in diffusion of the dopant from the glass into the semiconductor. Dopant control is achieved by controlling the concentration of the dopant in the ambient gas from which the doped glass is formed and by varying the temperature and pressure within the furnace. After the diffusion step, the doped glass may be removed from the semiconductor surface.

One disadvantage of this technique results from the difficulty in controlling dopant concentrations. At dopant concentrations below the solid solubility of the dopant in silicon at the diffusion temperature, relatively minute changes in temperature result in significant changes in the concentration of the dopant diffused into the semiconductor surface.

This typically limits the reproducibility of this method to concentrations at or near the solubility of the dopant in silicon, typically about $1 \times 10^{20}$ cm$^{-3}$. Such high concentrations inhibit reliable formation of very shallow junctions because of concentration dependent diffusivity and other effects.

Another disadvantage of this technique is that extra processing steps are required prior to the diffusion of the dopant into the semiconductor surface. Thin oxides such as the native oxide of silicon are commonly found on the surface of silicon semiconductors. Such thin oxides significantly reduce dopant diffusion from certain doped glasses, for example, borosilicate glass. The controlled precleaning required to remove such oxides is difficult to achieve in conjunction with the typical doped glass process.

A further disadvantage of both the ion implantation and the doped glass techniques is their limitations as to the type of surface features for which they are appropriate. For example, they are not readily suitable for doping the sidewalls of a deep trench, found in a semiconductor by, e.g., local etching of the semiconductor surface.

The ion implantation technique is essentially a line-of-sight method. If the area to be doped is "visible" to the ion source, it can be implanted. Trench sidewalls, however, present an extremely small surface area to incoming ions, creating great difficulty in controlling the ion dosage. Control of the ion dose per unit area of the sidewall is aggravated by variations in the angle of the sidewall to the ion beam.

Such variations may be caused by variation of the sidewall slope introduced during etching, shifts in orientation of the surface relative to the beam during placement in the implanter, and variation in the beam angle due to scanning of the beam across the surface. The typical results of ion implantation at slight angles onto a wafer with significant surface topography are non-uniform doped regions and regions without dopant.

Use of the doped glass technique to dope the sidewalls of a deep trench also often produces unsatisfactory results. As described above, doped glass may be formed by reacting a dopant containing gas with an oxidizer to form an oxide of the dopant. This oxide is then deposited on the surface of the semiconductor. However, depletion of reactants typically causes oxide deposition and dopant concentration to vary as a function of depth within a trench.

As noted above, various vapor diffusion techniques have also been used to form electrical junctions. One such technique is known as the two zone furnace process. This technique utilizes a furnace having two individually controllable heat zones. A dopant source is placed in the first zone, and a semiconductor surface is placed in the second zone. A slightly oxidizing gas is passed through the furnace and transports the vapor from the dopant source in the first zone to the semiconductor surface in the second zone. This process typically produces a doped oxide on the surface of the semiconductor. The first zone controls the vapor pressure of the dopant and can be eliminated if the dopant source used is sufficiently volatile at room temperature.

This technique has been used with reasonable success to produce junctions with dopant concentrations at or near the solid solubility of the dopant in silicon at the diffusion temperature. At lower concentrations, a relatively minute change in temperature results in significant changes in the concentration of the dopant diffused into the semiconductor surface. This limits the reproducibility of the two zone technique to high surface concentrations of dopant in the semiconductor.

Another vapor diffusion approach is known as the closed box technique. This technique utilizes a closed box containing a semiconductor surface and a dopant source. The dopant source is a solution of the oxide of the dopant in silicon dioxide. When the box is heated to diffusion temperature, it fills with the vapors of the dopant. The dopant then diffuses into the semiconductor surface.

This approach is limited because the system cannot approach a satisfactory near-equilibrium condition except when the box is saturated with the dopant. With such high concentrations of the dopant in the box, the dopant concentration in the semiconductor saturates at the maximum solid solubility of the dopant in silicon at the diffusion temperature. Thus, this method also is typically limited to high concentrations of dopant in the semiconductor.

What is needed therefore is a technique for forming very shallow electrical junctions which have a wider range of surface concentrations than are conveniently available with conventional methods. The technique should be adaptable for use with a wide range of semiconductor features having narrow openings, such as deep trenches. The needed technique should avoid the problems of conventional techniques, such as the channeling of the ion implantation method and the high concentration limitation of the doped glass and vapor diffusion techniques.

SUMMARY OF THE INVENTION

The preceding and other shortcomings of the prior art are addressed and overcome by the present invention which forms very shallow junctions by exposing semiconductor structures in a non-oxidizing ambient to a gas phase dopant, diluted by a non-oxidizing carrier such as an inert or reducing carrier gas, at elevated temperatures for a predetermined time.

The type of carrier gas used, inert or reducing, may depend on whether the surface of the semiconductor is already oxide free and whether there is a likelihood of forming an oxide on the surface thereof during doping. With an oxide free surface and an oxygen free ambient, inert gas may be used. When the ambient cannot be maintained completely free of oxygen, the use of a reducing gas may be required. Reducing gas at an elevated temperature enhances removal of thin native oxides often found on the surface of semiconductor materials prior to the introduction of the dopant gas. The use of hydrogen in the reducing gas enhances the removal of oxides.

The elimination of oxide formation on the surface of the semiconductor during junction formation allows the use of a relatively wide range of dopant gas concentrations. A corresponding relatively wide range of dopant concentrations may then be achieved in the resulting shallow junctions.

The techniques of the present invention provide the ability to at least partially separate the control of the junction depth from control of dopant concentration. The depth of the junction formed in the semiconductor is primarily dependent on the temperature of the semiconductor surface during diffusion and the duration of the exposure of the semiconductor to the gas phase dopant. The concentration of the doped area in the semiconductor is primarily dependent on the surface coverage of the dopant gas on the semiconductor during diffusion.

The separate control of junction depth and dopant concentration permits the formation of lightly doped shallow junctions as required for bipolar transistors, as well as forming junctions in deep trenches and other semiconductor features having high aspect ratios.

In particular, in a first aspect, the present invention provides a method of forming electrical junctions in semiconductor material by exposing an oxide free region of the surface of a semiconductor material to an ambient including a dilute concentration of dopant, heating the region to a temperature in the range of about 750° C. to about 1100° C., and controlling the duration of exposure of the heated region to the dilute dopant gas to be in the range of about 0.5 to about 100 minutes, preferably between 10 and 30 minutes.

In another aspect, the present invention provides apparatus for forming electrical junctions in semiconductor material including an oxide free region on the surface of a semiconductor material, means for heating the region to a temperature in the range of about 750° C. to about 1100° C., means for exposing the region to a dilute concentration of dopant gas at a pressure over the range from about $10^{-1}$ Torr to atmospheric pressure, and means for controlling the duration of exposure of the heated region to the dopant gas in the range of about 0.5 to about 100 minutes, preferably between 10 and 30 minutes.

These and other features and advantages of this invention will become further apparent from the detailed description that follows which is accompanied by one or more drawing figures. In the figures and description, numerals indicate the various features of the invention, like numerals referring to like features throughout both the drawings and the description.

DETAILED DESCRIPTION O THE PREFERRED EMBODIMENT

The present invention provides techniques for forming very shallow junctions, e.g., less than 0.2 μm thick, in semiconductor material by infusing dopants from a dilute gas into the semiconductor surface at an elevated temperature. The concentration of the doped region thus formed near the surface is a function of the concentration of the dopant gas at the surface during infusion. The dopant gas is diluted to the desired concentration by use of a carrier gas. If the surface is oxide free and the ambient is free of oxidizers, the carrier may be an inert gas. If an oxidizing contaminant is present in the ambient, a reducing gas may then be used to prevent formation of surface oxide during junction formation. The presence of such an oxide can affect the reproducibility of the dopant incorporation.

When the semiconductor material used is silicon, it has been found that unprepared surfaces are typically not oxide free. Silicon normally forms a native oxide 10Å to 30Å thick. This oxide may be removed by heating the silicon in a reducing gas then annealing the silicon prior to the introduction of the dopant gas. The use of hydrogen as the reducing gas enhances the removal of the oxides.

Figure 1:
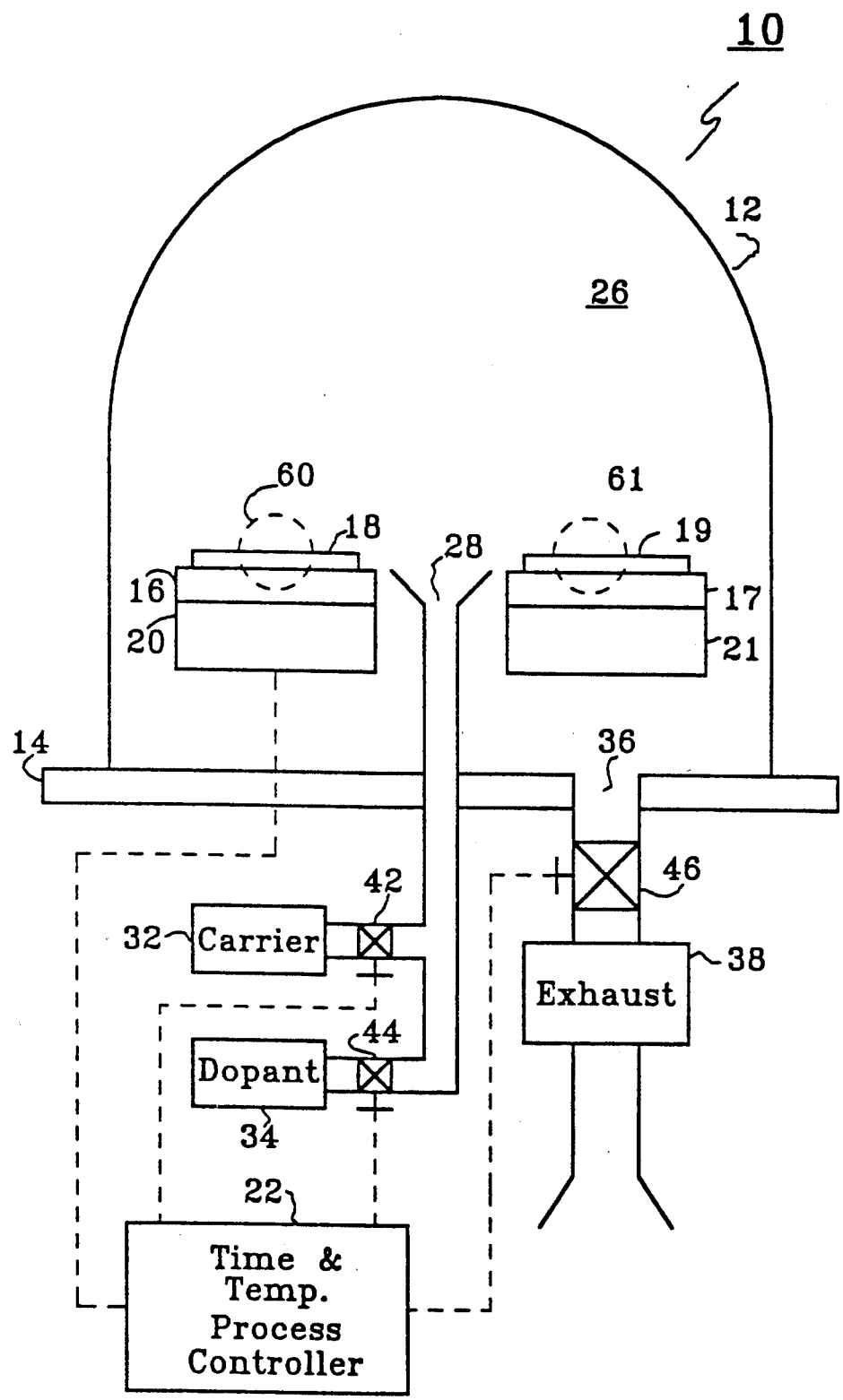
FIG. 1 is a schematic view of a system according to a preferred embodiment of the present invention.

Referring now to FIG. 1, semiconductor processing furnace system 10 incorporates the principles of the present invention and may be used to process the semiconductor surfaces of one or more devices, such as semiconductor substrates 18 and 19. Furnace 10 includes cover 12, base 14 and one or more wafer holding devices, such as susceptors 16 and 17. Semiconductor substrate 18, typically a silicon wafer, rests on susceptor 16 While substrate 19 rests On susceptor 17. Heating elements 20 and 21 are in facing Contact with susceptors 16 and 17. Time and temperature process controller 22 controls heating elements 20 and 21, as well as valves 42, 44, and 46 and exhaust 32, as described below.

Vacuum chamber 26 is formed by cover 12 and base 14. Chamber 26 includes opening 28 in Communication with carrier gas source 32 and dopant gas source 34. Opening 36 connects with exhaust 38 to permit evacuation of chamber 26. Exhaust 38 is controlled by controller 22 and may be any device capable of sustaining a pressure in chamber 26 over the range from about $10^{-1}$ Torr to atmospheric pressure.

Valves 42 and 44 control the inflow of carrier gas 32 and dopant gas 34, respectively, into the chamber 26. Valve 46 controls the outflow of gas through exhaust 38. Controller 22 operates valves 42, 44 and 46.

Heating elements 20 and 21 and controller 22 heat substrates 18 and 19 to a predetermined temperature selected from a typical range of temperatures of from about 750° C. to about 1100° C. Heating elements 20 and 21 and controller 22 are of the type commonly used With semiconductor processing furnaces and are capable of controlling the temperatures at the surfaces of substrates 18 and 19 for the time period required by the process. Heating elements 20 and 21 may be RF coils or other convenient and controllable heat sources. Controller 22 may be mechanical, electrical or computerized and may include one or more separate controllers and appropriate sensors.

Carrier gas 32 may be an inert gas or a reducing gas, such as hydrogen, and may be supplied from a compressed storage source. Dopant gas 34 may also be supplied from a compressed source and is typically the hydride of the selected dopant. For example, to introduce the p-type dopant boron into silicon, the hydride diborane $B_2H_6$ would be preferred. A typical concentration of dopant gas 34 in chamber 26 is in the range of about 1 part per million down to 1 part per billion in an ambient of carrier gas 32.

The techniques of the present invention for forming electrical junctions generally include exposing a silicon surface to a dopant gas in an inert or reducing atmosphere at an elevated temperature. Referring now in particular to substrate 18, after substrate 18 is placed on susceptor 16, chamber 26 may have a sustained pressure over the range from about $10^{-1}$ Torr to atmospheric pressure controlled by operation of valve 46 and exhaust 38. Valve 42 is operated to allow carrier gas 32 to enter chamber 26.

Heating element 20 is turned on and substrate 18 is heated to a preselected temperature. Typical temperatures for substrate 18 range from 750° C. to 1100° C. The currently preferred working temperatures are between 800° C. and 1000° C. Upon reaching the desired temperature, dopant gas 34 is introduced into chamber 26 by opening its associated valve 44.

Substrate 18 is exposed to dopant gas 34 in the ambient of carrier gas 32, at the preselected temperature for a predetermined process time in the range of about 0.5 to about 100 minutes, preferably between 10 and 30 minutes. Dopant gas valve 44 and heating element 20 are turned off after the expiration of this time and the semiconductor surface is allowed to cool. Junctions as shallow as 0.05 μm may be formed having a surface dopant concentration in the range of $1 \times 10^{19}$ cm$^{-3}$ using a process time and temperature of 15 minutes at 850° C.

Figure 2:
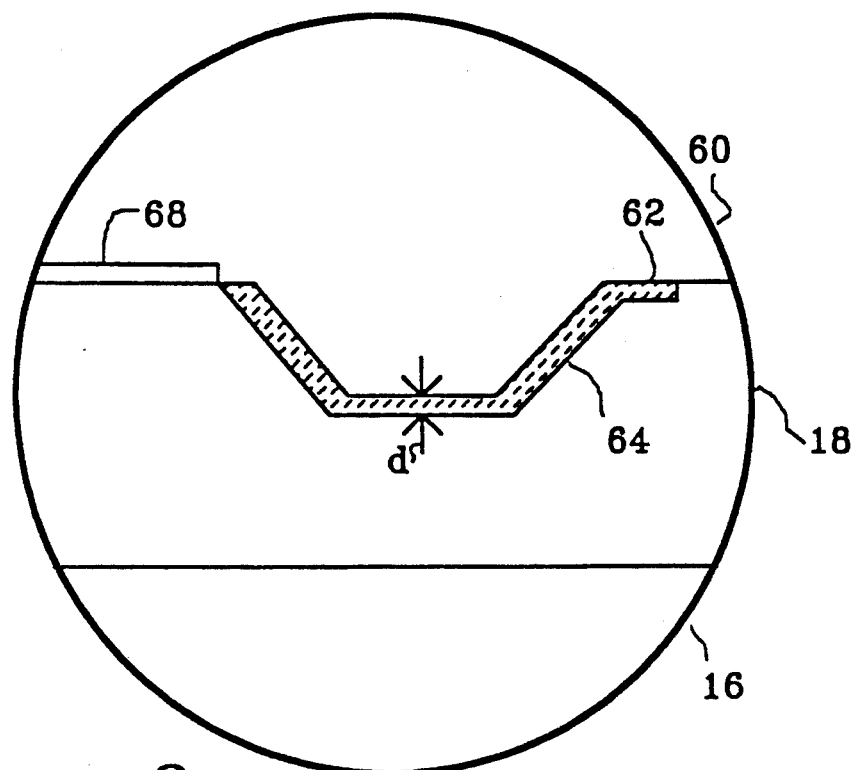
FIG. 2 is a large scale view of portion o of FIG. 1 showing an electrical junction formed by the present invention.

Referring now to FIG. 2, which is an enlarged view of portion 60 of substrate 18 as shown in FIG. 1, doped region 62 is formed in the surface of substrate 18. The Concentration of dopant in doped region 62 is a function of the concentration of dopant gas 34. The range of dopant gas concentrations can be varied from about 1 ppm down to about 1 ppb using flow-control techniques well known in the art. The resulting range of surface concentrations which may be achieved in doped region 62 are in the range of about $1 \times 10^{17}$ cm$^{-3}$ to about $3 \times 10^{19}$ cm$^{-3}$.

The depth of junction 64, shown as dimension d, formed by doped region 62 in substrate 18 is determined by the temperature at which substrate 18 is exposed to dopant gas 34 in semiconductor processing furnace 10 and the duration of the exposure. The lateral uniformity of dopant incorporated in doped region 62 is typically in the range of about ±2%.

Processing furnace 10 and the described procedure is also well suited for forming junctions in semiconductors having features with high aspect ratios, that is, features such as trenches with narrow openings in which the ratio of the vertical to lateral dimensions is on the order of 1 or more.

Figure 3:
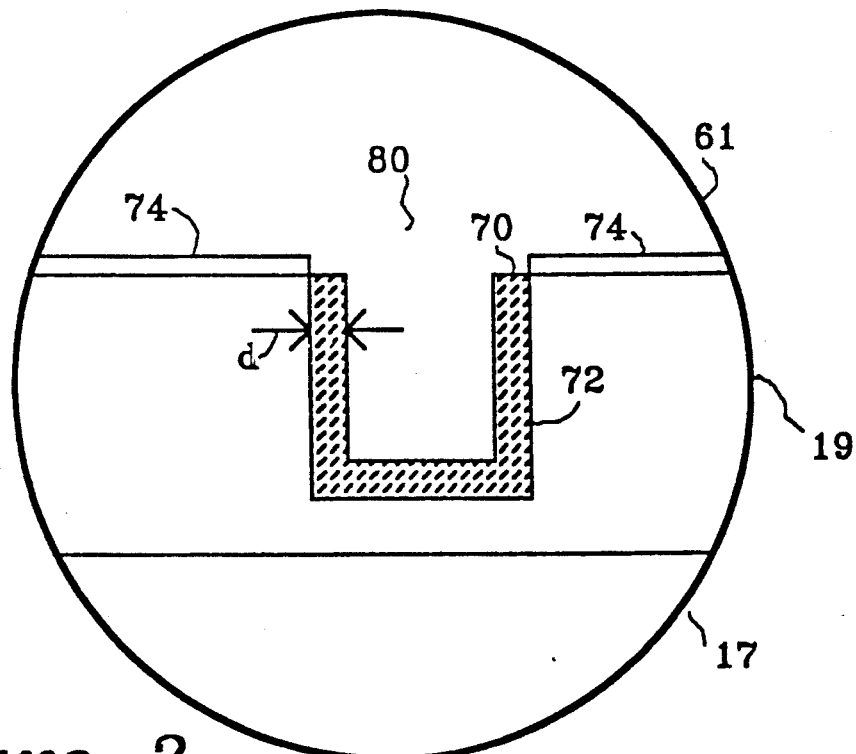
FIG. 3. is a large scale view of portion 1 of FIG. 1 showing an electrical junction formed by the present invention in a deep trench.

FIG. 3 is an enlarged view of portion 61 of substrate 19, as shown in FIG. 1, illustrating a typical feature having a high aspect ratio, such as trench so. As may be seen, doped region 70 is formed in trench 80. Such trenches when formed in silicon may typically be on the order of about 1μm wide by 3 μm to 5 μm deep. In high aspect ratio features such as trench 80, junction 72 may be formed having a depth dimension, shown in the figure as dimension d, of less than about 0.2 μm deep.

Referring now to both FIG. 2 and FIG. 3, doped regions 62 and 70 can be confined laterally by use of an appropriate masking material. One material commonly used to mask silicon is silicon oxide. A layer of silicon oxide 100Å to 200Å thick provides sufficient masking to prevent junction formation by the present invention. Silicon oxide masking may be accomplished by conventional photolithographic procedures. An oxide is first formed in the surface of the silicon, a resist is then applied over the oxide, the resist is exposed in a desired pattern, the exposed resist is removed to uncover some of the oxide, the uncovered oxide is etched off, and the remaining resist is chemically removed.

Junctions are formed in the oxide free surface of the silicon using the technique of the present invention. Remaining oxide 68 and 74 may then be removed using techniques well known in the art such as exposure to hydrofluoric acid.

The presence of a native oxide on substrate 18 can affect the reproducibility of junction formation. The use of hydrogen or other reducing gas as the ambient in chamber 26 prevents the creation of native oxide on silicon surfaces during the junction formation technique of the present invention. A native oxide already present on a silicon surface having a thickness of up to about 30Å may be removed by a high temperature annealing of the semiconductor in a hydrogen or other reducing gas ambient. Temperatures of greater than about 950° C. have been found to be sufficient to remove such oxides.

While this invention has been described with reference to its presently preferred embodiment, its scope is not limited thereto. Rather, such scope is only limited insofar as defined by the following set of claims and all equivalents thereof.

What is claimed is:

1. A method of forming electrical junctions in semiconductor material comprising the steps of:
   exposing an oxide free region of the surface of a semiconductor material to an ambient including a dopant gas the concentration of which is from about 1 part per million to about 1 part per billion;
   heating the region to a temperature in the range of about 750° C. to about 1100° C.; and
   controlling the duration of exposure of the heated region to the said dopant gas to be in the range of about 0.5 to about 100 minutes.

2. The method of claim 1 wherein the ambient includes a reducing gas as a carrier gas.

3. The method of claim 2 wherein the ambient includes hydrogen.

4. The method of claim 1 further comprising the step of:
   controlling the depth of the electrical junction by altering the duration of said exposure.

5. The method of claim 1 further comprising the step of:
   controlling the concentration of the dopant in the junction by adjusting the concentration of the dopant gas in the ambient.

6. The method of claim 1 further comprising the preliminary steps of:
   exposing the surface to a reducing gas; and
   the surface to a temperature and
   heating sufficient to remove surface oxides.

7. The method of claim 6 wherein the reducing gas includes hydrogen.

8. The method of claim 1 wherein the region is heated before exposure to the dopant.

9. The method of claim 1 wherein the region includes semiconductor features having aspect ratios in the range of about 1 or higher.

10. The method of claim 1 wherein the ambient is an oxygen free environment including an inert gas.

11. The method of claim 1 comprising he further step of:
   selectively preventing exposure of portions of the region to the dopant gas by use of a masking material.

* * * * *